United States Patent
Gao et al.

(10) Patent No.: US 9,419,129 B2
(45) Date of Patent: Aug. 16, 2016

(54) SPLIT GATE SEMICONDUCTOR DEVICE WITH CURVED GATE OXIDE PROFILE

(75) Inventors: Yang Gao, San Jose, CA (US); Kuo-In Chen, Los Altos, CA (US); Kyle Terrill, Santa Clara, CA (US); Sharon Shi, San Jose, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 12/603,028

(22) Filed: Oct. 21, 2009

(65) Prior Publication Data
US 2011/0089485 A1    Apr. 21, 2011

(51) Int. Cl.
H01L 29/78    (2006.01)
H01L 29/40    (2006.01)
H01L 29/66    (2006.01)
H01L 29/06    (2006.01)

(52) U.S. Cl.
CPC .......... *H01L 29/7813* (2013.01); *H01L 29/407* (2013.01); *H01L 29/66727* (2013.01); *H01L 29/66734* (2013.01); *H01L 29/7811* (2013.01); H01L 29/0615 (2013.01); H01L 29/0623 (2013.01); H01L 29/0696 (2013.01)

(58) Field of Classification Search
CPC ............ H01L 29/407; H01L 29/66727; H01L 29/7813; H01L 29/7811; H01L 29/66734; H01L 29/512; H01L 29/51; H01L 29/517
USPC ............ 257/330, 331, 332, E21.41, E29.262; 438/259, 270, 271, 589
See application file for complete search history.

(56) References Cited

U.S. PATENT DOCUMENTS

| | | | |
|---|---|---|---|
| 5,864,159 A | 1/1999 | Takahashi | |
| 6,031,265 A | 2/2000 | Hshieh | |
| 6,242,775 B1 | 6/2001 | Noble | |
| 6,255,683 B1 | 7/2001 | Radens et al. | |
| 6,281,547 B1 | 8/2001 | So et al. | |
| 6,291,298 B1 * | 9/2001 | Williams et al. | 438/270 |
| 6,309,929 B1 | 10/2001 | Hsu et al. | |
| 6,404,007 B1 * | 6/2002 | Mo et al. | 257/324 |
| 6,413,822 B2 | 7/2002 | Williams et al. | |
| 6,462,376 B1 | 10/2002 | Wahl et al. | |
| 6,489,204 B1 | 12/2002 | Tsui | |
| 6,495,884 B2 | 12/2002 | Harada et al. | |
| 6,525,373 B1 | 2/2003 | Kim | |
| 6,545,315 B2 | 4/2003 | Hshieh et al. | |
| 6,548,860 B1 | 4/2003 | Hshieh et al. | |

(Continued)

FOREIGN PATENT DOCUMENTS

DE    102005041322    3/2007
EP    0717450    6/1996

(Continued)

OTHER PUBLICATIONS

Hsu et al., "A Novel Trench Termination Design for 100-V TMBS Diode Application", IEEE Electron Device Letters, vol. 22, No. 11, Nov. 2001, pp. 551-552.

(Continued)

Primary Examiner — Thinh T Nguyen

(57) ABSTRACT

A split gate semiconductor device includes a trench gate having a first electrode region and a second electrode region that are separated from each other by a gate oxide layer and an adjacent dielectric layer. The boundary of the gate oxide layer and the dielectric layer is curved to avoid a sharp corner where the gate oxide layer meets the sidewalls of the trench.

13 Claims, 9 Drawing Sheets

(56) References Cited

U.S. PATENT DOCUMENTS

| | | |
|---|---|---|
| 6,621,107 B2 | 9/2003 | Blanchard et al. |
| 6,683,346 B2 | 1/2004 | Zeng |
| 6,707,128 B2 | 3/2004 | Moriguchi et al. |
| 6,781,199 B2 | 8/2004 | Takahashi |
| 6,838,722 B2 | 1/2005 | Bhalla et al. |
| 6,882,000 B2 | 4/2005 | Darwish et al. |
| 6,900,100 B2 * | 5/2005 | Williams et al. ............. 438/259 |
| 6,906,380 B1 | 6/2005 | Pattanayak et al. |
| 6,921,697 B2 | 7/2005 | Darwish et al. |
| 7,005,347 B1 | 2/2006 | Bhalla et al. |
| 7,009,247 B2 | 3/2006 | Darwish |
| 7,335,946 B1 | 2/2008 | Bhalla et al. |
| 7,345,342 B2 | 3/2008 | Challa et al. |
| 7,385,248 B2 * | 6/2008 | Herrick et al. ................ 257/330 |
| 7,393,749 B2 * | 7/2008 | Yilmaz et al. ................ 438/259 |
| 7,494,876 B1 | 2/2009 | Giles et al. |
| 7,544,571 B2 | 6/2009 | Park |
| 7,598,143 B2 | 10/2009 | Zundel et al. |
| 7,868,381 B1 | 1/2011 | Bhalla et al. |
| 7,936,009 B2 * | 5/2011 | Pan et al. ...................... 257/330 |
| 8,247,865 B2 | 8/2012 | Hirler |
| 8,629,505 B2 | 1/2014 | Nishiwaki |
| 8,686,493 B2 | 4/2014 | Thorup et al. |
| 2002/0036319 A1 | 3/2002 | Baliga |
| 2002/0056884 A1 | 5/2002 | Baliga |
| 2003/0086296 A1 | 5/2003 | Wu et al. |
| 2003/0178676 A1 | 9/2003 | Henninger et al. |
| 2003/0201502 A1 | 10/2003 | Hsieh |
| 2004/0021173 A1 | 2/2004 | Sapp |
| 2004/0038479 A1 | 2/2004 | Hsieh |
| 2004/0084721 A1 | 5/2004 | Kocon et al. |
| 2004/0113202 A1 | 6/2004 | Kocon et al. |
| 2005/0001268 A1 | 1/2005 | Baliga |
| 2005/0079676 A1 | 4/2005 | Mo et al. |
| 2005/0082591 A1 * | 4/2005 | Hirler et al. .................. 257/302 |
| 2005/0151190 A1 | 7/2005 | Kotek et al. |
| 2005/0167742 A1 * | 8/2005 | Challa et al. ................. 257/328 |
| 2006/0017056 A1 | 1/2006 | Hirler |
| 2006/0113577 A1 | 6/2006 | Ohtani |
| 2006/0209887 A1 | 9/2006 | Bhalla et al. |
| 2006/0214221 A1 | 9/2006 | Challa et al. |
| 2006/0273386 A1 * | 12/2006 | Yilmaz et al. ................ 257/330 |
| 2006/0281249 A1 * | 12/2006 | Yilmaz et al. ................ 438/243 |
| 2007/0004116 A1 | 1/2007 | Hshieh |
| 2007/0037327 A1 * | 2/2007 | Herrick et al. ................ 438/151 |
| 2007/0108511 A1 | 5/2007 | Hirler |
| 2007/0108515 A1 | 5/2007 | Hueting et al. |
| 2007/0132014 A1 | 6/2007 | Hueting |
| 2007/0155104 A1 | 7/2007 | Marchant et al. |
| 2007/0221952 A1 | 9/2007 | Thorup et al. |
| 2008/0073707 A1 | 3/2008 | Darwish |
| 2008/0076222 A1 | 3/2008 | Zundel et al. |
| 2008/0135889 A1 | 6/2008 | Session |
| 2008/0166845 A1 | 7/2008 | Darwish |
| 2008/0197407 A1 | 8/2008 | Challa et al. |
| 2008/0199997 A1 | 8/2008 | Grebs et al. |
| 2008/0265289 A1 | 10/2008 | Bhalla et al. |
| 2009/0035900 A1 | 2/2009 | Thorup et al. |
| 2009/0050959 A1 | 2/2009 | Madson |
| 2009/0057756 A1 | 3/2009 | Hshieh |
| 2009/0072301 A1 | 3/2009 | Bhalla et al. |
| 2009/0162989 A1 | 6/2009 | Cho et al. |
| 2009/0246923 A1 | 10/2009 | Park |
| 2009/0273026 A1 | 11/2009 | Wilson et al. |
| 2009/0309156 A1 | 12/2009 | Darwish et al. |
| 2010/0006928 A1 * | 1/2010 | Pan et al. ...................... 257/330 |
| 2011/0079843 A1 | 4/2011 | Darwish et al. |
| 2011/0089485 A1 | 4/2011 | Gao et al. |
| 2012/0043602 A1 | 2/2012 | Zeng et al. |
| 2012/0061753 A1 | 3/2012 | Nishiwaki |
| 2012/0267704 A1 | 10/2012 | Siemieniec et al. |
| 2013/0049072 A1 | 2/2013 | Heineck et al. |
| 2013/0221436 A1 | 8/2013 | Hossain et al. |

FOREIGN PATENT DOCUMENTS

| | | |
|---|---|---|
| JP | S63296282 | 2/1988 |
| JP | H03-211885 | 1/1990 |
| JP | 03211885 | 9/1991 |
| JP | H07-045817 | 2/1995 |
| JP | H07-235676 | 9/1995 |
| JP | H08-167711 | 6/1996 |
| JP | H10-173175 | 6/1998 |
| JP | H11-068102 | 3/1999 |
| JP | 2000223705 | 8/2000 |
| JP | 2001308327 | 11/2001 |
| JP | 2002110984 | 4/2002 |
| JP | 2003282870 | 10/2003 |
| JP | 2003309263 | 10/2003 |
| JP | 2004241413 | 8/2004 |
| JP | 2005032941 | 2/2005 |
| JP | 2005057050 | 3/2005 |
| JP | 2005191221 | 7/2005 |
| JP | 2006202931 | 8/2006 |
| JP | 2007529115 | 10/2007 |
| JP | 2008543046 | 11/2008 |
| JP | 2008546189 | 12/2008 |
| JP | 2008546216 | 12/2008 |
| JP | 2009505403 | 2/2009 |
| JP | 2009141005 | 6/2009 |
| JP | 2009542002 | 11/2009 |
| JP | 2010505270 | 2/2010 |
| JP | 2011258834 | 12/2011 |
| JP | 2012059943 | 3/2012 |
| JP | 2013580980 | 3/2013 |
| WO | 9403922 | 2/1994 |
| WO | 0025363 | 5/2000 |
| WO | 0025365 | 5/2000 |
| WO | 0042665 | 7/2000 |
| WO | 0051167 | 8/2000 |
| WO | 0065646 | 11/2000 |
| WO | 2005065385 | 7/2005 |
| WO | 2006/127914 A2 | 11/2006 |
| WO | 2007021701 A2 | 2/2007 |
| WO | 2007129261 | 11/2007 |
| WO | 2009026174 A1 | 2/2009 |
| WO | 2011050115 | 4/2011 |

OTHER PUBLICATIONS

Imai; K. et al., "Decrease In Trenched Surface Oxide Leakage Currents By Rounding Off Oxidation", Extended Abstracts of the 18th (1986 International) Conference on Solid State Devices and Materials, Tokyo, Aug. 20, 1986, pp. 303-306.

Baba, Y. et al., "High Reliable UMOSFET with Oxide-nitride Complex Gate Structure", IEEE, May 26, 1997, pp. 369-372.

Initial Publication with ISR, Nov. 7, 2013, International application No. PCT/US2013/038956, Korean Intellectual Property Office, Republic of Korea.

Initial Publication with ISR, Nov. 7, 2013, International application No. PCT/US2013/038957, Korean Intellectual Property Office, Republic of Korea.

* cited by examiner

SPLIT GATE SEMICONDUCTOR DEVICE WITH CURVED GATE OXIDE PROFILE

FIELD OF THE INVENTION

Embodiments in accordance with the present invention generally pertain to semiconductor devices.

BACKGROUND

To conserve power, it is important to reduce power losses in transistors. In a metal oxide semiconductor field effect transistor (MOSFET) device, and in particular in the class of MOSFETs known as power MOSFETs, power losses can be reduced by reducing the device's drain-to-source on-resistance (Rdson).

Split gate power MOSFETs, also known as shielded gate trench MOSFETs, utilize a greater doping concentration in the epitaxial layer to reduce Rdson. Split gate power MOSFETs incorporate trench gates that include a first electrode (e.g., polysilicon, or poly-1) that is separated from a second electrode (e.g., polysilicon, or poly-2) by an isolation layer (e.g., a differential oxide layer). From a manufacturing point of view, proper formation of the isolation layer can be challenging.

In one conventional manufacturing process, the isolation layer is grown on an exposed first polysilicon (poly-1) region at the same time that the gate oxide is formed. However, the isolation layer grows much faster on top of the poly-1 than along the sidewalls of the poly-1 region. As a result, a sharp corner is formed when the polysilicon (poly-2) for the second electrode is deposited onto the isolation layer. The sharp corner can affect the reliability of the isolation layer because of the point discharge effect, and can also increase the overlap between the gate-to-source and gate-to-drain, thus increasing Ciss (the sum of the gate-source capacitance and the gate-drain capacitance). Furthermore, because the isolation layer conforms to the profile of the underlying poly-1 region, any void or defect on the poly-1 surface will be translated into a distorted oxide profile, which may significantly reduce the poly-1 poly-2 breakdown. In addition, because the isolation layer and the gate oxide are formed simultaneously, their thicknesses are highly correlated. As a result, the isolation layer cannot be made thicker to compensate for defects or other manufacturing issues without also making the gate oxide thicker.

In another conventional manufacturing process, a sidewall oxide and the polysilicon for the first electrode are deposited in a trench. Then, the first polysilicon region is recess etched and the trench is refilled with a dielectric material that has a similar etch rate as that of the sidewall oxide. After planarization, the dielectric material and the sidewall oxide are etched back to form the isolation layer. However, it can be difficult to achieve a uniform etch rate for both the dielectric and the oxide. A difference in the etch rate could affect the uniformity of the isolation layer, which can affect the device's on-resistance as well as the input capacitance. Also, after the etch is performed, a sharp corner is formed where the material remaining in the trench meets the trench sidewalls. The sharp corner can significantly retard the gate oxide thickness, which in turn can significantly reduce gate oxide breakdown.

SUMMARY

Accordingly, a semiconductor device that avoids the shortcomings described above, and a viable method of producing such a device, would be advantageous.

In one embodiment according to the invention, a split gate semiconductor device (e.g., a power MOSFET) includes a trench gate having a first electrode (e.g., poly-1) region and a second electrode (e.g., poly-2) region that are separated from each other by a gate oxide layer and an adjacent dielectric layer. The boundary of the gate oxide layer and the dielectric layer is curved to avoid a sharp corner where the gate oxide layer meets the sidewalls of the trench.

During fabrication, in one embodiment, the poly-1 region is recess etched and the sidewall oxide is etched away. The recess is refilled with a dielectric material and planarized; thus, the region above the poly-1 region contains the same type of material (the dielectric material). The dielectric material is then etched back; because the same material is present throughout the region, the problem of trying to achieve a uniform etch rate for different materials is avoided. The dielectric region is etched to form a curved (e.g., concave) profile. When the overlying oxide layer is formed, it will conform to the shape of the dielectric region and thus will also have a curved profile. A sharp corner where the dielectric region and oxide layer meet the sidewalls of the trench is thereby avoided.

Relative to a conventional approach, there is a less overlap between gate-to-source and gate-to-drain, which reduces Ciss. Any defects or voids in the poly-1 surface will be filled when the recess is refilled with dielectric, thus achieving a proper profile instead of a distorted one. The absence of a sharp corner solves the gate oxide retardation problem associated with a conventional approach.

These and other objects and advantages of the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention. Like numbers denote like elements throughout the drawings and specification.

DETAILED DESCRIPTION

Figure 1A:
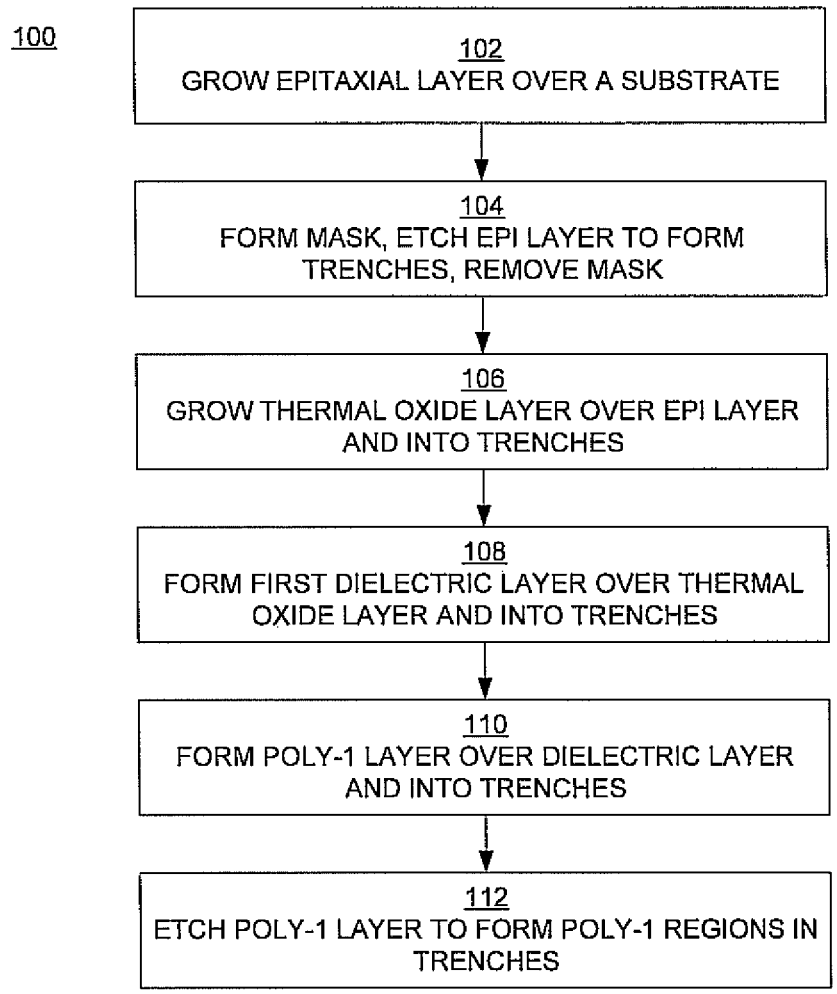
FIGS. 1A, 1B, and 1C illustrate a flowchart of a process that is used in the fabrication of a semiconductor device according to embodiments of the present invention.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "growing," "etching" or the like, refer to actions and processes (e.g., flowchart 100 of FIGS. 1A, 1B and 1C) of semiconductor device fabrication.

The figures are not drawn to scale, and only portions of the structures, as well as the various layers that form those structures, may be shown in the figures. Furthermore, fabrication processes and steps may be performed along with the processes and steps discussed herein; that is, there may be a number of process steps before, in between and/or after the steps shown and described herein. Importantly, embodiments in accordance with the present invention can be implemented in conjunction with these other (perhaps conventional) processes and steps without significantly perturbing them. Generally speaking, embodiments in accordance with the present invention can replace portions of a conventional process without significantly affecting peripheral processes and steps.

As used herein, the letter "n" refers to an n-type dopant and the letter "p" refers to a p-type dopant. A plus sign "+" or a minus sign "−" is used to represent, respectively, a relatively high or relatively low concentration of the dopant.

The term "channel" is used herein in the accepted manner. That is, current moves within a FET in a channel, from the source connection to the drain connection. A channel can be made of either n-type or p-type semiconductor material; accordingly, a FET is specified as either an n-channel or p-channel device. Some of the figures are discussed in the context of an n-channel device, specifically an n-channel power MOSFET; however, embodiments according to the present invention are not so limited. That is, the features described herein can be utilized in a p-channel device. The discussion of an n-channel device can be readily mapped to a p-channel device by substituting p-type dopant and materials for corresponding n-type dopant and materials, and vice versa.

Figure 1B:
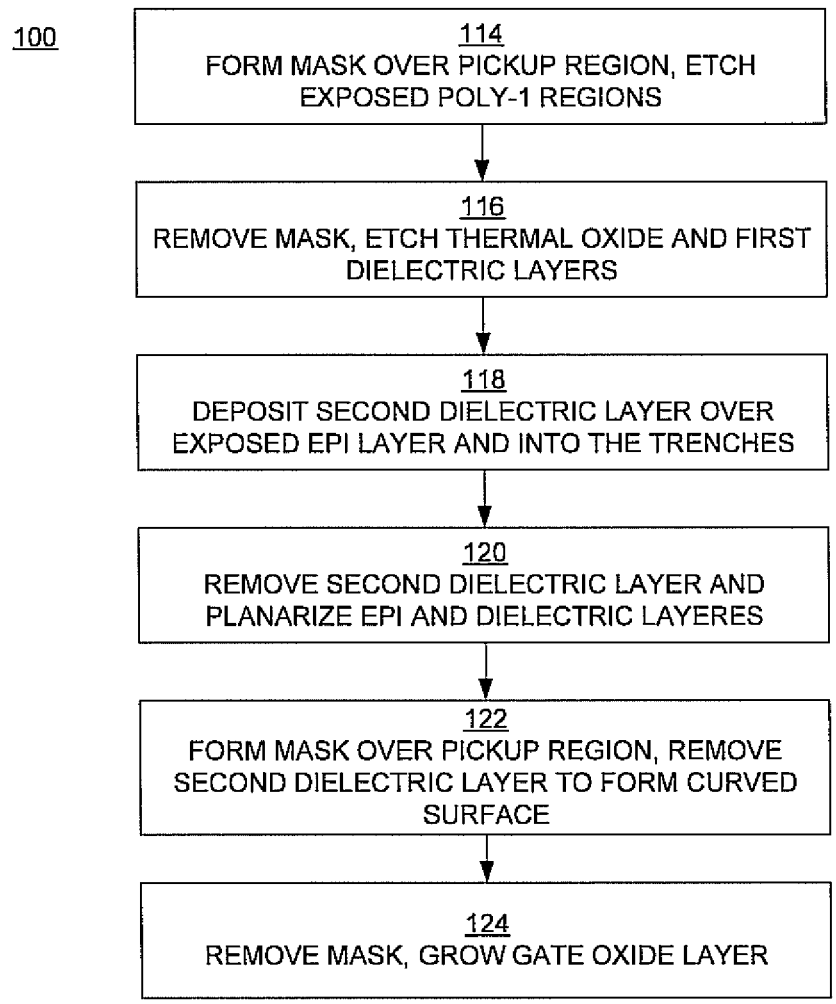
Figure 1C:
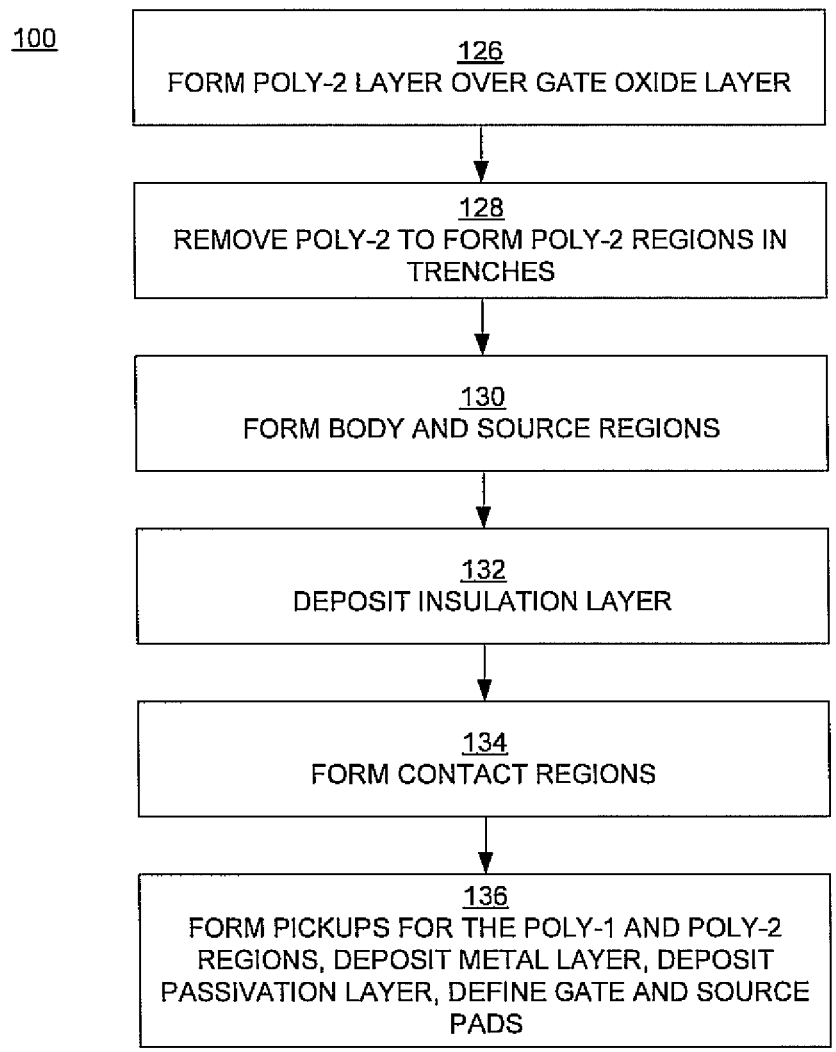
Figure 18:
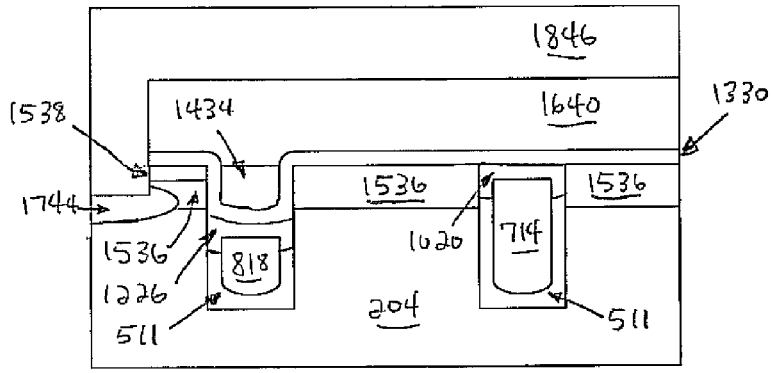
Figure 19:
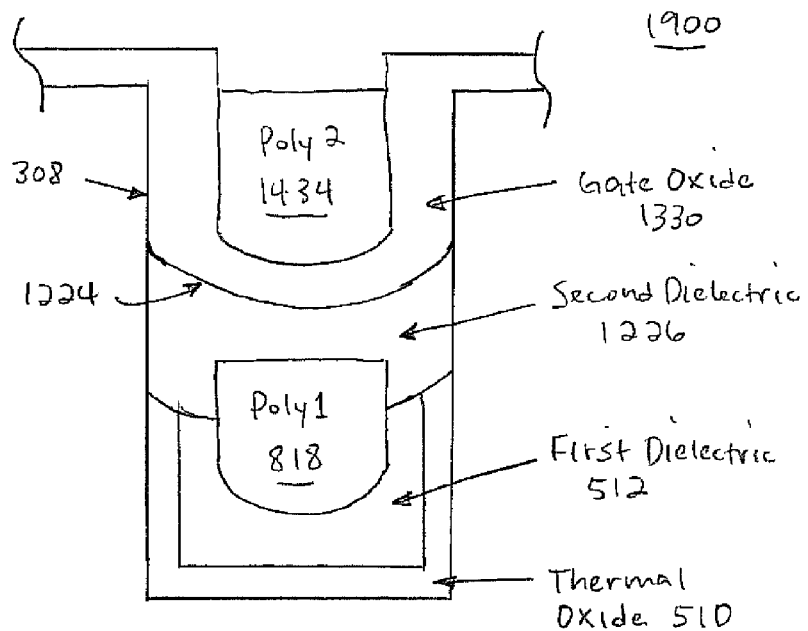
FIG. 19 is a cross-sectional view showing elements of a semiconductor device in an embodiment according to the present invention.

FIGS. 1A, 1B, and 1C illustrate a flowchart 100 of one embodiment of a process that is used in the fabrication of semiconductor devices such as the device partially illustrated in FIG. 19. Although specific steps are disclosed in the flowchart 100, such steps are exemplary. That is, embodiments according to the present invention are well suited to performing various other steps or variations of the steps recited in the flowchart 100. The flowchart 100 is discussed in conjunction with FIGS. 2-18, which are cross-sectional views showing selected stages in the fabrication of a semiconductor device according to an embodiment of the present invention.

Figure 2:
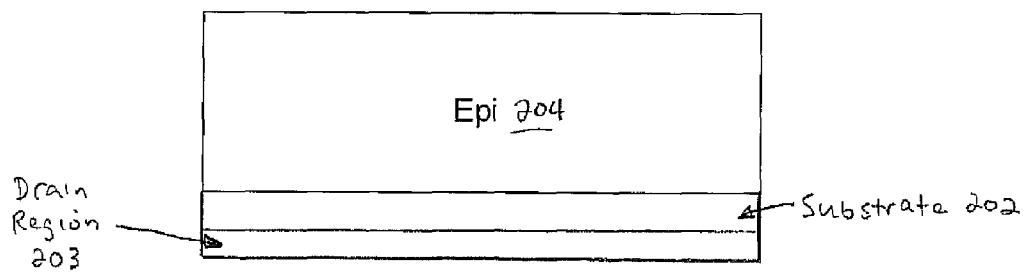
FIGS. 2, 3, 4, 5, 6, 7, 8, 9, 10, 11, 12, 13, 14, 15, 16, 17, and 18 are cross-sectional views showing selected stages in the fabrication of a semiconductor device according to embodiments of the present invention.

In block 102 of FIG. 1A, with reference also to FIG. 2, an epitaxial (epi) layer 204 is grown over a substrate 202 (which may not be shown in subsequent figures). In an n-channel device, the epitaxial layer includes p-dopant and is grown over an n+ substrate. The structure includes a drain region 203 on the bottom surface of the substrate 202.

Figure 3:
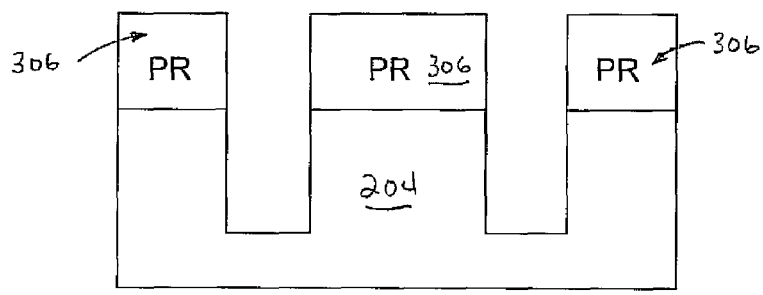
Figure 4:
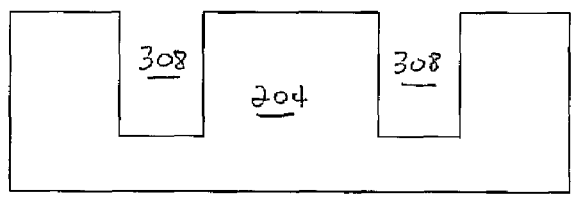

In block 104 of FIG. 1A, with reference also to FIG. 3, a photoresist (PR) mask 306 is formed over selected portions of the epi layer 204. Then, the exposed portions of the epi layer 204 are etched away to form trench-like cavities, referred to as trenches 308. The mask 306 is then removed, as shown in FIG. 4.

Figure 5:
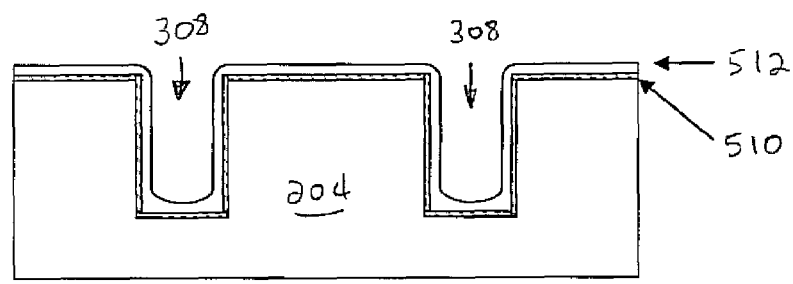

In block 106 of FIG. 1A, with reference also to FIG. 5, a thermal oxide layer 510 is produced (grown) over the epi layer 204 and along the sidewalls and bottom surfaces of the trenches 308. In one embodiment, the thermal oxide layer has a thickness of approximately 300 Angstroms (A).

In block 108, a dielectric layer 512 (also referred to herein as the first dielectric layer) is formed over the thermal oxide layer 510, extending into the trenches 308 along their sidewalls and bottoms as shown in FIG. 5. In one embodiment, the dielectric layer 512 includes sub-atmospheric undoped silicon glass (SAUSG). In one such embodiment, the thickness of the dielectric layer is approximately 1300 A.

Figure 6:
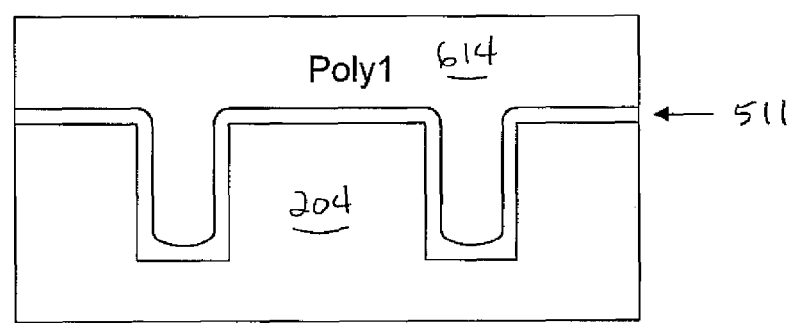

In block 110 of FIG. 1A, with reference also to FIG. 6, a first polysilicon layer 614 is formed over the dielectric layer 512 and into the trenches 308 (in FIG. 6 and subsequent figures, the dielectric layer 512 and the thermal oxide layer 510 may be represented as a single layer 511). The first polysilicon layer may also be referred to herein as poly-1.

Figure 7:
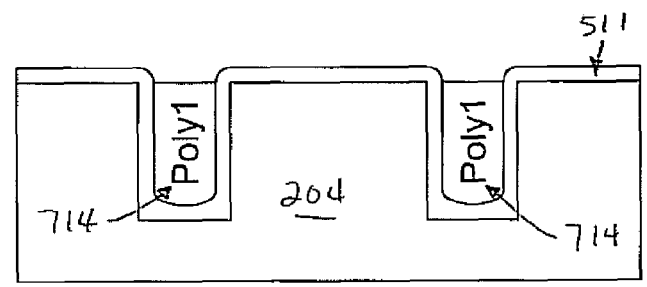

In block 112 of FIG. 1A, with reference also to FIG. 7, the poly-1 is removed using, for example, a chemical-mechanical planarization or polishing (CMP) process. The remaining poly-1 regions 714 can also be etched back a relatively small amount (e.g., about 0.1 microns) so that the exposed (e.g., top) surface of the poly-1 is slightly recessed relative to the layer 511.

Figure 8:
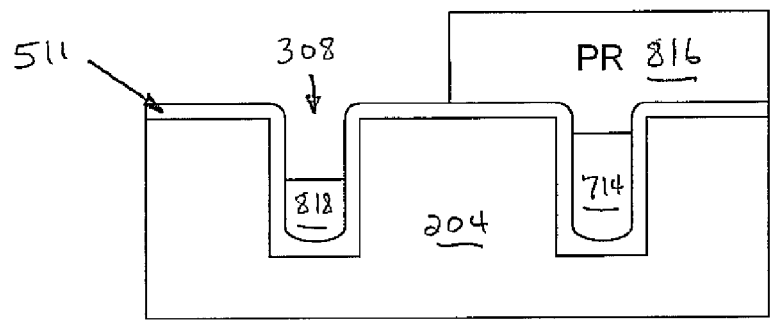

In block 114 of FIG. 1B, with reference also to FIG. 8, a PR mask 816 is formed over selected poly-1 regions—that is, the core region of the structure is left exposed, while the pickup or termination region of the structure is covered by the mask 816. After the mask is applied, the exposed poly-1 is etched back (recess etched) to form a poly-1 region 818 in the core region that fills the trench 308 to a lesser height than the poly-1 region 714 in the pickup or termination region.

Figure 9:
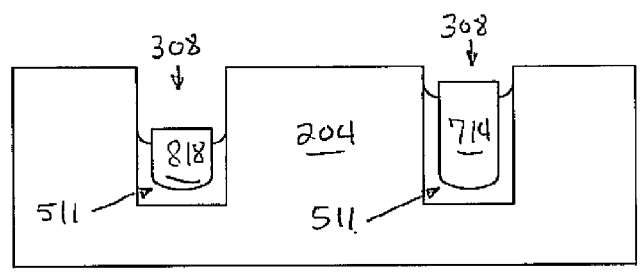

In block 116 of FIG. 1B, with reference also to FIG. 9, the PR mask 816 is removed, and then a blanket buffered oxide etch (BOE) is performed to remove portions of the layer 511. More specifically, the layer 511 is removed along the mesas of the epi layer 204, and from the sidewalls of the trenches 308, partially exposing the sides of the poly-1 regions 714 and 818 as shown in FIG. 9. The layer 511 is removed to a height that is slightly less than the height of the regions 714 and 818.

Figure 10:
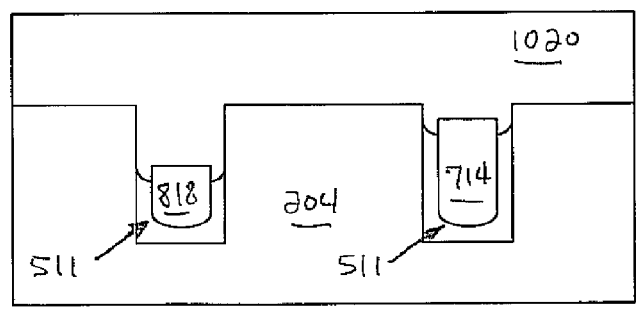

In block 118 of FIG. 1B, a dielectric layer 1020 is deposited over the exposed surfaces of the epi layer 204 and into the trenches 308 as shown in FIG. 10 using, for example, a sub-atmospheric pressure chemical vapor deposition (SACVD) process. In one embodiment, the dielectric layer 1020 includes SAUSG (e.g., 6K SAUSG), which is densified. Any defects or voids in the surface of the poly-1 regions 714 and 818 will be filled when the recess is refilled with dielectric, thus achieving a proper profile instead of a distorted one.

Figure 11:
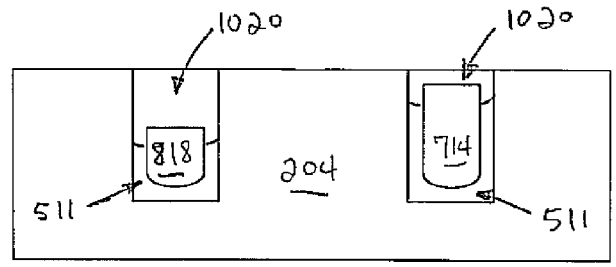

In block 120 of FIG. 1B, some of the dielectric layer 1020 is removed using a CMP process, for example, and the remainder of the dielectric layer is removed using a dry etch, such that the exposed surfaces of the epi layer 204 and the dielectric layer 1020 are planarized as shown in FIG. 11. Thus, the same type of material (e.g., SAUSG) is in the region above the poly-1 region 818.

Figure 12:
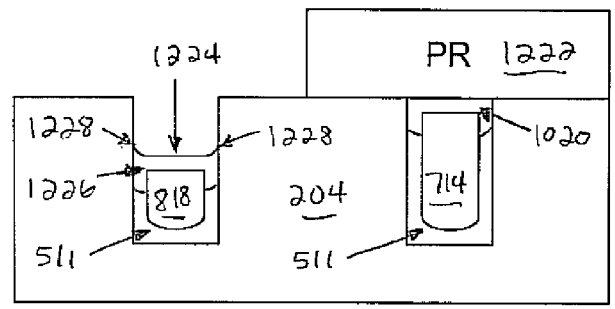

In block 122 of FIG. 1B, a PR mask 1222 is formed over the pickup or termination region of the structure, leaving the core region exposed as shown in FIG. 12. A proprietary oxide etch is then performed to remove a portion of the dielectric layer 1020 to form the dielectric layer 1226 (also referred to herein as the second dielectric layer). Because the same material is present throughout the dielectric layer 1020, the problem of trying to achieve a uniform etch rate for different materials is avoided.

Significantly, the surface 1224 of the dielectric layer 1226 is curved. In FIG. 12, a cross-section of the structure is illustrated; in three dimensions, the surface 1224 of the dielectric layer 1226 is concave. Because the surface 1224 is curved, a sharp corner where the dielectric layer 1226 meets the sidewalls 1228 of the trench is thereby avoided.

Figure 13:
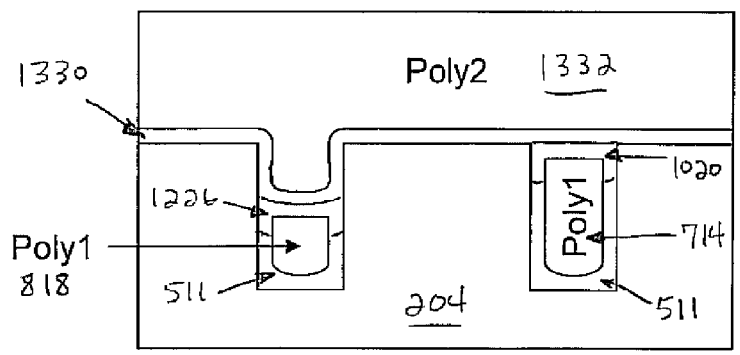

In block 124 of FIG. 1B, the PR mask 1222 is removed and a gate oxide layer 1330 is produced (grown) over the exposed surfaces of epi layer 204, dielectric layer 1226, and dielectric layer 1020, as shown in FIG. 13. Because the surface 1224 is curved, the gate oxide layer 1330 will also be curved (concave-shaped) above the dielectric layer 1226. Thus, the gate oxide retardation problem, associated with the presence of sharp corners in conventional approaches, is avoided. Also, relative to conventional approaches, there is a less overlap between gate-to-source and gate-to-drain, which reduces Ciss.

In block 126 of FIG. 1C, a second polysilicon layer 1332 is then formed over the gate oxide layer 1330. The second polysilicon layer may also be referred to herein as poly-2.

Figure 14:
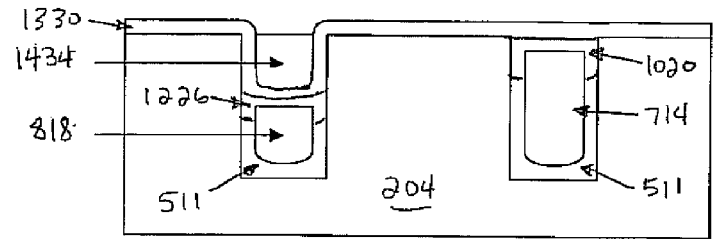

In block 128 of FIG. 1C, with reference also to FIG. 14, the poly-2 is removed using, for example, a CMP process to form a poly-2 region 1434. The poly-2 region 1434 can also be etched back a relatively small amount so that the exposed (e.g., top) surface of the poly-2 is slightly recessed relative to the gate oxide layer 1330. The poly-1 region 818 and the poly-2 region 1434 correspond to the first and second electrodes of a split gate in a split gate power MOSFET, also known as a shielded gate trench MOSFET.

Figure 15:
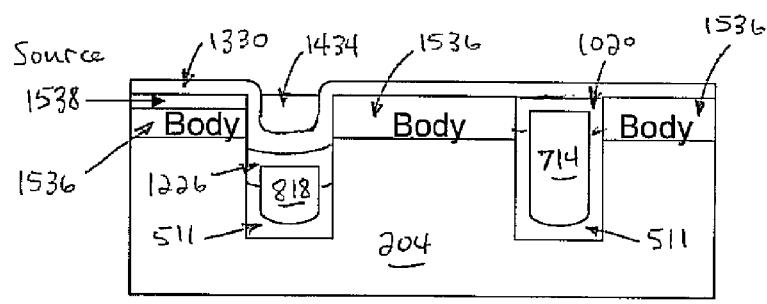

In block 130 of FIG. 1C, with reference also to FIG. 15, a body implant is performed to form the body regions 1536. In an n-channel device, for example, the body regions 1536 include p-type (p-) dopant. A mask (not shown) can then be formed to shield the pickup or termination region, and then a source implant is performed to form the source region 1538. In an n-channel device, for example, the source region 1538 includes n-type (n+) dopant. The mask is then removed.

Figure 16:
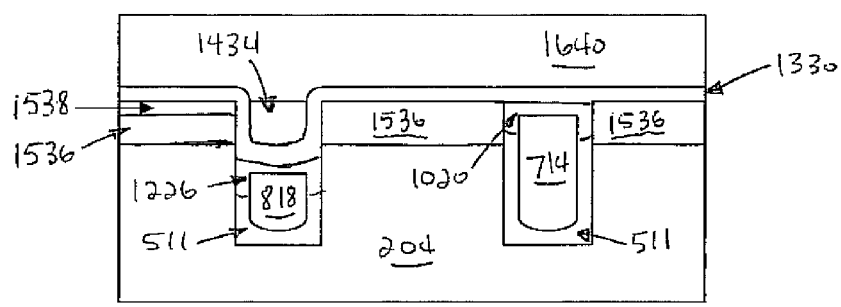

In block 132 of FIG. 1C, a layer of low temperature oxide (LTO) followed by a layer of borophosphosilicate glass (BPSG) are deposited—these layers are collectively identified as layer 1640 in FIG. 16.

Figure 17:
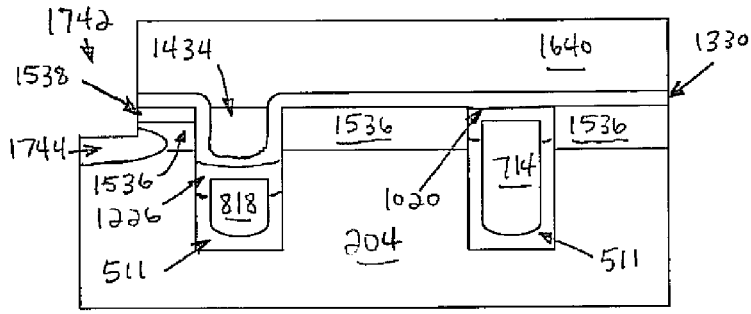

In block 134 of FIG. 1C, with reference also to FIG. 17, a mask (not shown) is used to selectively remove portions of the layer 1640, the source region 1538, and the body region 1536, forming an opening 1742. At the bottom of the opening, in an n-channel device, dopant is then implanted to form the p-type (p+) contact region 1744.

In block 136 of FIG. 1C, another mask (not shown) can be formed over selected areas and material can be removed beneath openings in the mask to form pickups (not shown) to the poly-1 regions 818 and 714 and the poly-2 region 1434. A metal layer 1846 can be deposited over the structure as shown in FIG. 18, and then another mask (not shown) can be formed to selectively remove portions of the metal layer to form electrical connections. A passivation layer (not shown) can be optionally deposited, and then another mask (not shown) can be applied to etch the passivation layer to define gate and source pads.

FIG. 19 illustrates an embodiment of a trench or split gate 1900. The gate 1900 includes a first electrode (e.g., polysilicon, poly-1) region 818 and a second electrode (e.g., polysilicon, poly-2) region 1434 that are separated from each other by a gate oxide layer 1330 that is adjacent to a second dielectric layer 1226. The second dielectric layer 1226 is formed after the first dielectric layer 512 and separates the first dielectric layer 512 from the gate oxide layer 1330.

Significantly, the boundary 1224 of the gate oxide layer 1330 and the second dielectric layer 1226 is curved. The boundary 1224 traverses the width of the gate trench 308. More specifically, the boundary is concave in shape relative to the underlying dielectric layer 1226 (and therefore convex in shape relative to the gate oxide layer 1330).

The absence of a sharp corner where the second dielectric layer 1226 and the gate oxide layer 1330 meet the sidewalls of the trench 308 is avoided, thus addressing the gate oxide retardation problem associated with a conventional approach. Also, relative to a conventional approach, there is a less overlap between gate-to-source and gate-to-drain, which reduces Ciss.

In summary, embodiments of power MOSFET devices, and embodiments of methods for fabricating such devices, are described. The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A semiconductor device comprising:
   a source region;
   a drain region; and
   a trench gate formed within a trench-like region, said trench gate comprising:
      a first layer comprising a thermal oxide layer and a first dielectric layer, wherein said thermal oxide layer is along the bottom surface and sidewall surfaces of said trench-like region, and wherein said first dielectric layer is over said thermal oxide layer;
      a first electrode region adjacent said first dielectric layer, wherein the height of said first layer is less than the height of said first electrode region;
      a second dielectric layer adjacent said first dielectric layer and said first electrode region, said second dielectric layer having a uniform composition throughout;
      a gate oxide layer adjacent said second dielectric layer, wherein the boundary of said gate oxide layer and said second dielectric layer is curved; and
      a second electrode region adjacent said gate oxide layer.

2. The semiconductor device of claim 1 wherein said first electrode region and said second electrode region comprise polysilicon.

3. The semiconductor device of claim 1 wherein said boundary is concave relative to said second dielectric layer and convex relative to said gate oxide layer.

4. The semiconductor device of claim 1 wherein said first dielectric layer and said second dielectric layer each comprises sub-atmospheric undoped silicon glass (SAUSG).

5. The semiconductor device of claim 1 comprising a power metal oxide semiconductor field effect transistor (MOSFET) device.

6. The semiconductor device of claim 1 wherein said gate oxide layer also separates said second electrode region from said source region.

7. A semiconductor device comprising:
   a source region;
   a drain region; and
   a gate formed within a trench-like region within said semiconductor device, wherein said gate comprises:
   a thermal oxide layer lining the bottom of said trench-like region and extending to a height only partially up the sidewalls of said trench-like region;
   a first dielectric region adjacent said thermal oxide layer and extending to a height that does not exceed said height of said thermal oxide layer;
   a first electrode region adjacent said first dielectric region, wherein the height of said thermal oxide layer and said first dielectric region is less than the height of said first electrode region;
   a second electrode region above said first electrode region in said trench-like region; and
   a second dielectric region adjacent said thermal oxide layer, said first dielectric region, and said first electrode region, said second dielectric region having a uniform composition throughout and also having a surface that traverses the entire width of said trench-like region between said first and second electrode regions, wherein said surface is concave.

8. The semiconductor device of claim 7 wherein said first electrode region and said second electrode region comprise polysilicon.

9. The semiconductor device of claim 7 further comprising a gate oxide layer that separates said second dielectric region from said second electrode region.

10. The semiconductor device of claim 9 wherein said second dielectric region separates said first dielectric region from said gate oxide layer.

11. The semiconductor device of claim 7 wherein said first dielectric region and said second dielectric region each comprises sub-atmospheric undoped silicon glass (SAUSG).

12. The semiconductor device of claim 7 comprising a power metal oxide semiconductor field effect transistor (MOSFET) device.

13. The semiconductor device of claim 1 wherein said gate oxide layer also separates said second electrode region from said source region.

* * * * *